United States Patent [19]

Moyson

[11] 4,066,484
[45] Jan. 3, 1978

[54] METHOD OF MANUFACTURE OF A GOLD DIFFUSED THYRISTOR

[75] Inventor: Joseph Moyson, Union Springs, N.Y.

[73] Assignee: General Electric Company, Auburn, N.Y.

[21] Appl. No.: 616,404

[22] Filed: Sept. 24, 1975

Related U.S. Application Data

[62] Division of Ser. No. 517,523, Oct. 24, 1974, abandoned.

[51] Int. Cl.² ............................................. H01L 21/22
[52] U.S. Cl. .................................. 148/187; 148/188; 148/189; 357/39
[58] Field of Search ................. 148/186, 187, 188, 189

[56] References Cited

U.S. PATENT DOCUMENTS

| 3,317,359 | 5/1967 | Engbert | 148/186 |
| 3,440,113 | 4/1969 | Wolley | 148/187 |
| 3,625,781 | 12/1971 | Joshi et al. | 148/189 |
| 3,645,808 | 2/1972 | Kamiyama et al. | 148/187 |

*Primary Examiner*—G. Ozaki
*Attorney, Agent, or Firm*—R. J. Mooney; S. B. Salai

[57] ABSTRACT

Disclosed is a thyristor and a method for the manufacture thereof. An auxiliary dopant, such as gold, is diffused into the cathode emitter region and the area immediately therearound. The auxiliary dopant is selected from among those known to stimulate charge carrier recombination. Consequently charge carrier recombination in the vicinity of the cathode emitter is enhanced and rapid turnoff of the device is promoted. Both SCR and triac embodiments are disclosed.

8 Claims, 6 Drawing Figures

METHOD OF MANUFACTURE OF A GOLD DIFFUSED THYRISTOR

This is a division of application Ser. No. 517,523 filed Oct. 24, 1974, entitled, "Gold Diffused Thyristor And Method of Manufacture," now abandoned.

BACKGROUND OF THE INVENTION

This invention relates to thyristors and, more particularly to gold doped fast turnoff thyristors.

Since their introduction, thyristors have become more popular as circuit designers have continued to employ them in new and different ways. As new applications for thyristors are developed, greater emphasis is placed on improving the performance of the devices under demanding conditions of operation. Different applications require that the emphasis be placed on different characteristics of the device. For example, some potential applications will become commerically feasible only if the cost of the thyristors can be reduced. Other applications require that the devices be able to withstand higher reverse voltages or that they switch from a conductive to a nonconductive state more rapidly. Thus, the device designer is faced with a multifaceted problem.

One of the principal concerns of the device designer is the interrelationship among the various device characteristics. For example, it is known that if gold is diffused into the interior of a thyristor, the minority carrier lifetime is decreased and thus turnoff time is reduced. However, the effect of the gold diffusion step on the cost of the device must be considered. Further, heavy blanket gold doping increases thyristor leakage current. Yet, in an effort to simplify and reduce the number of manufacturing steps, gold diffused thyristors have generally been manufactured with a blanket gold diffusion process. Consequently, excessive leakage current is sometimes a problem in gold diffused thyristors. Processes for localized gold diffusion have been developed. See, for example, U.S. Patent Application Ser. No. 405,489, filed on Oct. 11, 1973, in the name of Richard W. Kennedy, et al, and assigned to the assignee of the present invention, now U.S. Pat. No. 3,941,625. However, these processes frequently necessitated the addition of several manufacturing steps so that, while thyristors with good electrical characteristics were provided, cost sometimes became a problem.

It is, therefore, an object of this invention to provide a thyristor that possesses the rapid turnoff capability characteristic of gold doped devices yet is less expensive and exhibits a smaller leakage current than heretofore known gold doped devices. It is also an object of this invention to provide a method for making the subject thyristor.

SUMMARY OF THE INVENTION

This invention is characterized by a gold doped fast turnoff thyristor and a method for the manufacture thereof. Conventional semiconductor processsing steps are employed through the diffusion of the cathode emitter layer. Following diffusion of the cathode emitter layer, the diffusion mask is left in place and an auxiliary dopant that stimulates carrier recombination is diffused into the semiconductor body. Utilization of the cathode emitter mask insures that the auxiliary dopant diffuses only into the cathode emitter and the area therearound, where it is most effective in enhancing fast turnoff characteristics but does not contribute substantially to excess leakage current. Furthermore, utilization of a preexisting mask minimizes the cost involved in the gold doping process. Both gold diffused fast turnoff triacs and SCRs can readily be made by substantially the same methods.

DESCRIPTION OF THE DRAWINGS

These and other features and objects of the present invention will become more apparent upon a perusal of the following description taken in conjunction with the accompanying drawings in which.

DESCRIPTION OF THE PREFERRED EMBODIMENTS

Figure 1:
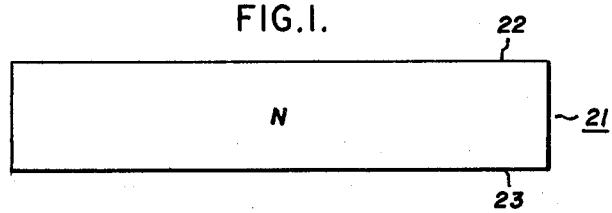
FIG. 1 is an elevation view of a silicon wafer such as is utilized in the practice of the subject invention.

Referring first to FIG. 1 there is shown a silicon wafer 21 defining two substantially parallel major surfaces 22 and 23. The wafer 21 is doped with a selected impurity such that it exhibits a selected conductivity type. For example, assume that the wafer 21 is doped with phosphorus to be of N-type conductivity. Selection of wafer thickness is within the ability of those skilled in the art and will depend on specific processes to be employed, voltage desired, etc., but will generally be in the range of 8–12 mils.

Figure 2:
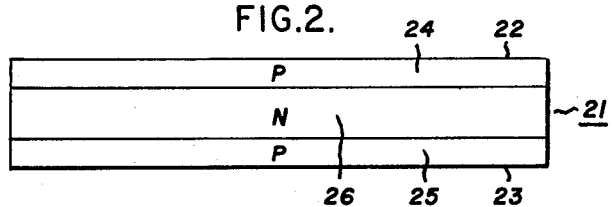
FIGS. 2 and 3 show intermediate processing stages encountered when practicing the subject invention.

Referring now to FIG. 2, the next processing step is illustrated. A dopant is diffused from each of the major surfaces 22 and 23 to form layers 24 and 25 of the opposite, in this example P, type conductivity. The dopant can be boron, gallium or aluminum and a proper depth will be reached in approximately 30 hours at about 1250° C. A layer 26 of N-type conductivity remains in the center of the wafer 21.

Figure 3:
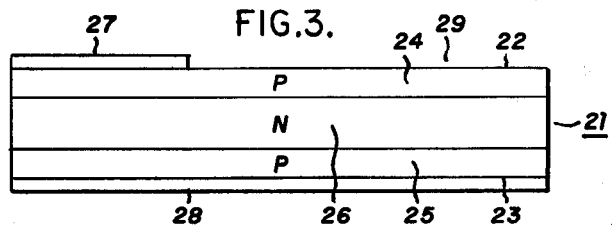

Referring next to FIG. 3, the subsequent processing step is illustrated. A mask 27, such as an oxide mask, is applied on the major surface 22. A second mask or layer of oxide 28 is also applied or grown on the major surface 23. An opening 29 is defined by the mask 27. The opening 29 is depicted in FIG. 3 as the right two-thirds of the surface 22 and it will be referred to as a cathode emitter opening 29 inasmuch as it exposes the region of the surface 22 that will be adjacent the cathode emitter layer of the SCR to be made.

Figure 4:
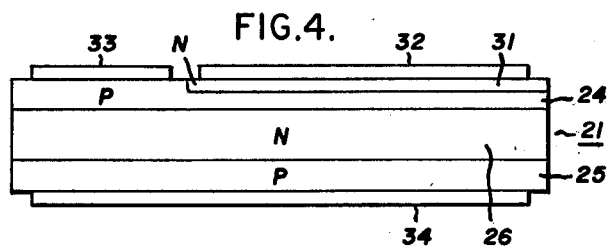
FIG. 4 is a sectional elevation view of a gold diffused fast turnoff semiconductor controlled rectifier fabricated in accordance with the teachings herein.

A cathode emitter dopant, such as arsenic or antimony, is applied to the exposed portions of the major surface 22 through the cathode emitter mask 27 and is driven partially through the layer 24 to form an N-type cathode emitter layer 31 as illustrated in FIG. 4. Phosphorus should not be used inasmuch as it will getter the auxiliary dopant that is to be applied later. The diffusion process for the cathode emitter includes a predeposition of about ½ hour at 1050° and a drive of about 10 hours at 1250° C. During the drive portion of the diffusion, a thin oxide layer may be formed over the cathode emitter 31 on the major surface 22. If that occurs, the oxide layer is next removed. Removal of the thin oxide layer leaves the mask 27 substantially unaffected inasmuch as the oxide layer is several orders of magnitude thinner than the mask.

Following removal of this thin oxide layer, an auxiliary dopant is diffused through the cathode emitter opening 29. The auxiliary dopant stimulates carrier recombination. For example, gold or platinum can be used.

If gold is selected as the auxiliary dopant, it can be diffused at a temperature of from 800° to 900° C. for a time of from 15 to 120 minutes. The time and temperature is selected to insure that the gold permeates the cathode emitter region 31 and the area immediately therearound. However, it is desirable to prevent the gold from diffusing too far from the cathode emitter to prevent undesirably high leakage currents.

Following the diffusion of the auxiliary dopant in the cathode emitter layer 31, any desired passivation steps are taken and contacts are applied after so much of the masks 27 and 28 as necessary are removed. The contacts will generally include a cathode contact 32, a gate contact 33, and an anode contact 34.

The device illustrated in FIG. 4 will be recognized by those skilled in the art as a semiconductor controlled rectifier. The difference between the device depicted in FIG. 4 and a conventional gold diffused SCR is that by the present invention the gold is selectively diffused only into the vicinity of cathode emitter region 31 utilizing the original cathode emitter mask 27.

Figure 5:
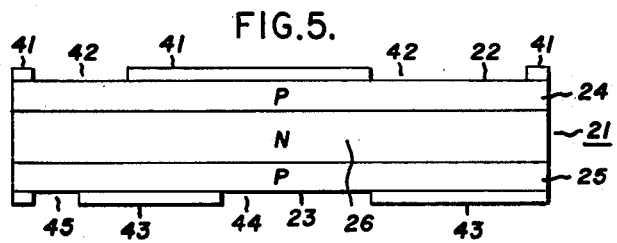
FIG. 5 is an elevation view illustrating an intermediate processing stage when utilizing the subject method to fabricate a triac.

The present invention is also useful for providing gold diffused fast turnoff triacs. In order to make a triac, the aforementioned processing, through the step illustrated in FIG. 2, is followed. Then, a different masking configuration is used. A triac masking configuration is illustrated in FIG. 5. A first cathode emitter mask 41 outlines what appear to be two cathode emitter openings 42 on the upper major surface 21. In reality, the openings 42 can comprise a single U-shaped opening. The connecting portion is not shown in the cross section illustrated in FIG. 5. On the lower surface 23, a second cathode emitter mask 43 outlines a second cathode emitter opening 44. Also defined on the lower major surface 23 is a gate opening 45.

Figure 6:
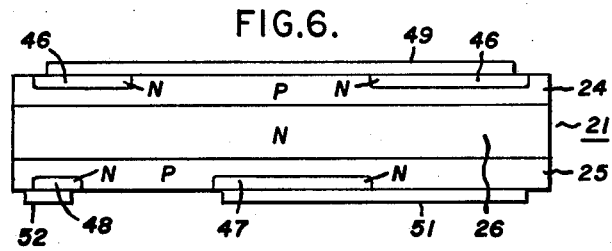
FIG. 6 is a sectional elevation view of a gold diffused fast turnoff triac fabricated in accordance with the teachings herein.

An N-type dopant, such as arsenic or antimony, is deposited in the openings 42, 44, and 45. The deposition can be carried out, for example, for ½ hour at approximately 1050° C. Following the dopant deposition, a drive step is performed. Drive can be accomplished at approximately 1250° C. for approximately 10 hours. As a result of this diffusion, a cathode emitter layer 46, a second cathode emitter layer 47, and a gate region 48 are formed as illustrated in FIG. 6. The five-layer structure illustrated in FIG. 6 will be recognized by those skilled in the art as one form of triac.

Following the N diffusion, any oxide layer that has grown in the openings 42, 44, and 45 is removed. Next, an auxiliary dopant, such as gold, is diffused into the cathode emitters 46 and 47 and the gate region 48. The gold diffusion can be carried out at a temperature of approximately 800° to 900° C. for approximately 15 to 120 minutes. The time and temperature of the gold diffusion should be selected so that the gold permeates the cathode emitter layers 46 and 47 and enters the area therearound.

The gate region 48 can be masked during the gold diffusion process if it is desired that the gate remain gold free. In some instances, an oxide may be formed during the arsenic or antimony diffusion that in itself will be sufficient to exclude an adequate amount of gold from the gate region.

Following the gold diffusion, passivants, if any, and contacts are applied by conventional methods. For example, a main terminal two contact 49 is applied to the upper surface 22 and a main terminal one contact 51 is applied to a portion of the lower surface 23 as illustrated in FIG. 6. A gate contact 52 is applied as shown.

Consequently, it will be appreciated that there has been disclosed a method for manufacturing gold diffused fast turnoff triacs and SCRs which involves only an inexpensive change from current manufacturing techniques. Specifically, a cost saving is provided when practicing the present method inasmuch as a preexisting cathode emitter mask is utilized for gold diffusion. Further, since no appreciable amount of gold reaches the interior N layer 26, leakage current is not appreciably increased.

In view of the foregoing, many modifications and variations of the present invention will be obvious to those skilled in the art. For example, while the SCR and triac illustrated above have been shown as individual devices manufactured in a semiconductor wafer, it will be appreciated that a plurality of small devices can easily be formed simultaneously in a single wafer while still utilizing the teachings herein. Furthermore, other dopants and diffusion cycles will readily be discerned. Consequently, it is expected that the invention will be limited only by the following claims.

What is claimed is:

1. In a method of making a thyristor utilizing a diffusion mask in the formation, at a first temperature, of a cathode emitter characterized by an impurity type selected from the group consisting of arsenic and antimony, the improvement consisting of the step of diffusing, at a second temperature lower than the said first temperature, essentially only into said cathode emitter and the area therearound, using said diffusion mask, an auxiliary dopant to reduce the carrier lifetime in said cathode emitter while maintaining the carrier lifetime in the remainder of said device.

2. A method according to claim 1 wherein said auxiliary dopant is gold and said second temperature is between about 800° and 900° C.

3. A method according to claim 2 said thyristor is a semiconductor controlled rectifier.

4. A method according to claim 2 wherein said thyristor is a triac comprising two cathode emitters, and wherein each of said two cathode emitters is doped with gold.

5. A method of making a thyristor comprising the steps of:
   providing a semiconductor wafer having two substantially parallel major surfaces and exhibiting a selected conductivity type;
   diffusing into said wafer, from each of said major surfaces, a dopant such that a layer of the opposite conductivity type is provided adjacent each of said major surfaces;
   applying a mask to one of said major surfaces, said mask defining a cathode emitter opening that defines and leaves exposed the surface of a cathode emitter;
   diffusing into said wafer, through said cathode emitter opening, at a first temperature, a cathode emitter dopant selected from the group consisting of arsenic and antimony to form a cathode emitter of said selected conductivity type; and diffusing into said wafer, at a second temperature lower than said first temperature, through said cathode emitter opening, an auxiliary dopant that permeates essentially only said cathode emitter and enters the area immediately therearound, said auxiliary dopant being for stimulating carrier recombination essentially only in said cathode emitter and the area therearound without affecting the remainder of the device.

6. A method according to claim 5 wherein said thyristor is a triac and a mask defining a cathode emitter is formed on each of said major surfaces a cathode emitter is formed adjacent each of said major surfaces and said auxiliary dopant is diffused into each of said cathode emitters.

7. A method according to claim 5 wherein said auxiliary dopant is gold and said mask is an oxide mask.

8. A method according to claim 5 wherein said gold is diffused at a temperature in the range of 800° to 900° C. for a time of 15 to 120 minutes.

* * * * *